United States Patent [19]

Foerstner et al.

[11] Patent Number: 5,691,224
[45] Date of Patent: Nov. 25, 1997

[54] METHOD OF MAKING BICMOS CIRCUIT

[75] Inventors: Juergen Foerstner, Mesa, Ariz.; Myriam Combes, Plaisance-du-Touch, France; Arlette Marty-Blavier, Fouzins, France; Guy Hautekiet, Plaisance-du-Touch, France

[73] Assignee: Motorola, Inc., Schaumburg, Ill.

[21] Appl. No.: 668,655

[22] Filed: Jun. 25, 1996

[30] Foreign Application Priority Data

Jun. 30, 1995 [FR] France .................................. 95 07905

[51] Int. Cl.⁶ .......................................... H01L 21/70
[52] U.S. Cl. ........................ 437/56; 437/34; 437/57; 437/58; 437/59; 148/DIG. 9; 257/274; 257/370; 257/378
[58] Field of Search ...................... 437/26, 59, 56, 437/57, 58, 34; 148/DIG. 9; 257/274, 370, 378

[56] References Cited

U.S. PATENT DOCUMENTS 5,245,209  9/1993  Ishigaki .
5,406,106  4/1995  Hirai et al. .

FOREIGN PATENT DOCUMENTS

2670324  6/1992  France .
0071526  3/1990  Japan ........................................ 437/26
2137262  8/1990  Japan .
0232929  9/1990  Japan ........................................ 437/26

*Primary Examiner*—John Niebling
*Assistant Examiner*—Long Pham
*Attorney, Agent, or Firm*—Harry A. Wolin; Rennie William Dover

[57]  ABSTRACT

A method of manufacturing an integrated circuit having a buried layer of a low doped type of conductivity (2) and a buried layer of a highly doped type of the same conductivity (3) by masking a substrate (1) so as to define open areas on the substrate where it is desired to provide the two buried layers and doping the open areas of the substrate with a low concentration of dopants to form the low doped type of buried layer (2) is formed. Then one open area where the low doped type of buried layer (2) is formed is masked and the other open area is doped with a high concentration of dopants to form the highly doped type of buried layer (3).

8 Claims, 9 Drawing Sheets

FIG. 25

METHOD OF MAKING BICMOS CIRCUIT

FIELD OF THE INVENTION

This invention relates to a method of manufacturing integrated circuits, more particularly, though not exclusively, to a method of manufacturing bipolar devices.

BACKGROUND OF THE INVENTION

Bipolar devices are usually manufactured in a substrate over a buried layer, which can be either a highly doped (+) or a low doped (−) type of either type of conductivity (P or N). There are therefore four possible different types of buried layer (P+, P−, N+, N−). In order to maximise the density of devices on the chip, the spacing between the buried layers, which must be isolated from each other to prevent parasitic currents, should be minimised. In known processes, if two adjoining buried layers are of the same type, then they can be formed at the same type using the same mask, so that the spacing between them is only dependent on variations in the critical dimensions of the mask.

When buried layers of different types are required to be adjoining, however, they are manufactured in separate steps using separate masks so that the spacing depends not only on variations in the critical dimensions of two separate masks, but also on variations in the alignment of the masks to a reference point. Thus, if adjoining buried layers are of different types, then the spacing between them has had to be increased to allow for all the variations.

It is therefore an object of the present invention to provide a method of manufacturing buried layers in a substrate which overcomes, or at least reduces, the problems of the prior art.

BRIEF SUMMARY OF THE INVENTION

Accordingly, the invention provides a method of manufacturing an integrated circuit having at least one buried layer of a low doped type of either conductivity and at least one buried layer of a highly doped type of either conductivity, the method comprising the steps of:

providing a substrate;

masking the substrate so as to define at least two open areas on the substrate where it is desired to provide the at least two buried layers;

doping the open areas of the substrate with a low concentration of dopants whereby at least the low doped type of buried layer is formed;

masking one open area where the low doped type of buried layer is formed;

doping the other open area with a high concentration of dopants whereby the high doped type of buried layer is formed; and removing both masks from the substrate.

The method can be used either in a pure bipolar manufacturing process or in a BiCMOS manufacturing process where both bipolar and CMOS devices are manufactured on the same chip.

BRIEF DESCRIPTION OF THE DRAWINGS

One embodiment of the invention will now be more fully described, by way of example, with reference to the drawings of which.

DETAILED DESCRIPTION OF THE DRAWINGS

Figure 1:
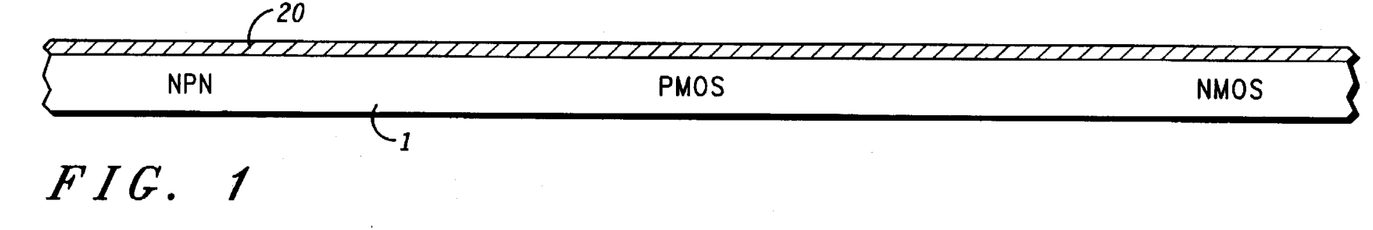
FIGS. 1 to 23 show the steps involved in the manufacturing process for forming a PMOS, NMOS and an NPN device on the same substrate.

Thus, as shown in FIG. 1, a starting semiconductor wafer 1 is of P-type monocrystalline silicon substrate with a <100> crystallographic orientation, having 6 to 8.5 ohm-cm bulk resistivity. The substrate 1 is thermally oxidized until an oxide layer 20 of approximately 1500 Å thickness is produced thereon.

Figure 2:
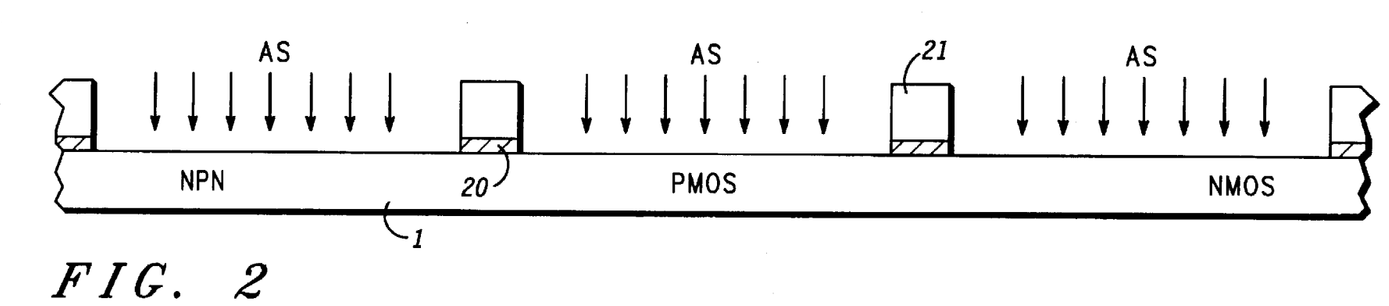
Figure 3:
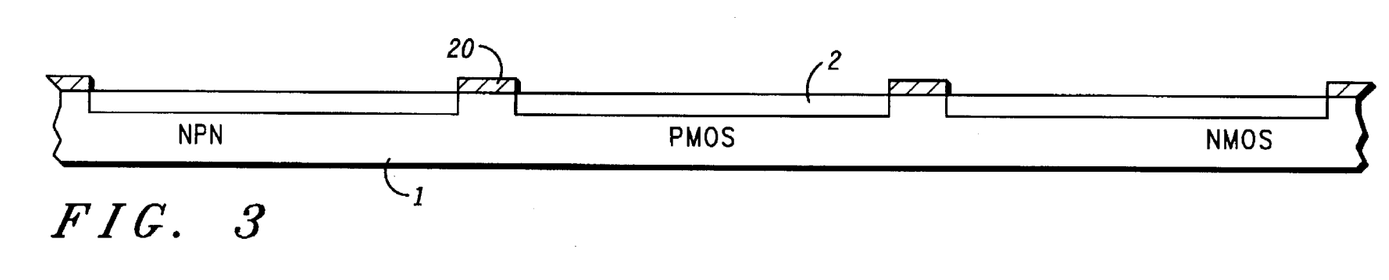

Two N-type buried layers regions are then defined by means of a first masking or patterning step with photoresist, indicated by reference 21 in FIG. 2, and by a subsequent wet etch of the exposed oxide layer 20 until the underlying silicon substrate 1 is exposed, as shown. An Arsenic (As) ion implantation is then performed, as shown schematically in FIG. 2. The dose is about 2.5E13 at/cm$^2$, and the energy is approximately 50 KeV. After removing completely the residual photoresist 21, an annealing treatment is performed, slightly re-oxidizing the exposed surface of the silicon substrate 1 to about 200 Å. The annealing cycle is as follows: firstly, the wafers are driven for approximately 90 seconds in an oxygen ($O_2$) atmosphere; next, hydrogen chloride (HCl) is introduced to about 3% of the total atmosphere and a dry oxidation is done for approximately 19 minutes; finally, the wafers are driven for approximately 300 minutes in a nitrogen ($N_2$) atmosphere. The Arsenic previously implanted thus diffuses in the substrate 1 to form N− buried layers, indicated by reference 2 in FIG. 3, in the defined areas of the surface of the substrate 1.

Figure 4:
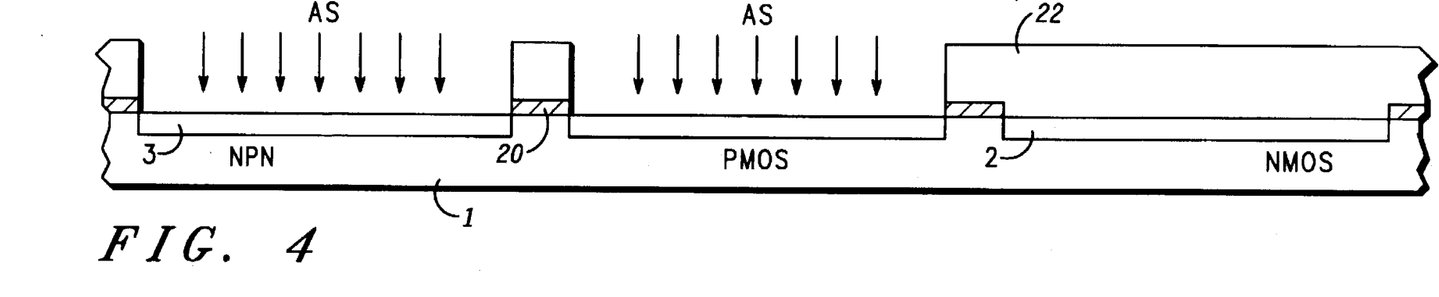

Next, a second masking or patterning step with photoresist 22, as shown in FIG. 4, is carried out, masking the previously doped area for the NMOS device and leaving the NPN and PMOS areas unmasked. Then a heavy Arsenic implant is carried out, as shown schematically in FIG. 4. The dose is about 5E15 at/cm$^2$, and the energy is approximately 50 KeV. After removing completely the residual photoresist 22, the exposed surfaces are thermally re-oxidized: firstly, a dry oxidation is performed with 3% HCl for approximately 10 minutes at about 890° C.; then, a steam cycle is carried out at about 890° C. for approximately 39 minutes; and finally the wafers are driven for approximately 95 minutes in $N_2$ at about 1200° C. thus forming N+ regions 3. As a result, an oxide layer of about 900 Å thickness is formed on the N− regions 2 and of about 4,000 Å on the N+ regions 3.

At this point in the process, the N− and N+ regions are clearly defined. The regions submitted only to the first implant step become N− layers 2, and the regions where both implant steps were performed become N+ layers 3. Both the N− and N+ regions are self-aligned since their locations were defined by means of only one patterning step, the first one using the photoresist layer 21. The N− buried layers 2 indicate the future location of the NMOS device, and the N+ buried layers 3, which provide the collector of the NPN device, indicate the future location of the NPN device as well as the location of the PMOS device. It will, of course, be appreciated that, since the alignment and spacing of the N− and the N+ regions is defined in the first masking step, their spacing can be less than if two separate steps were required.

Figure 5:
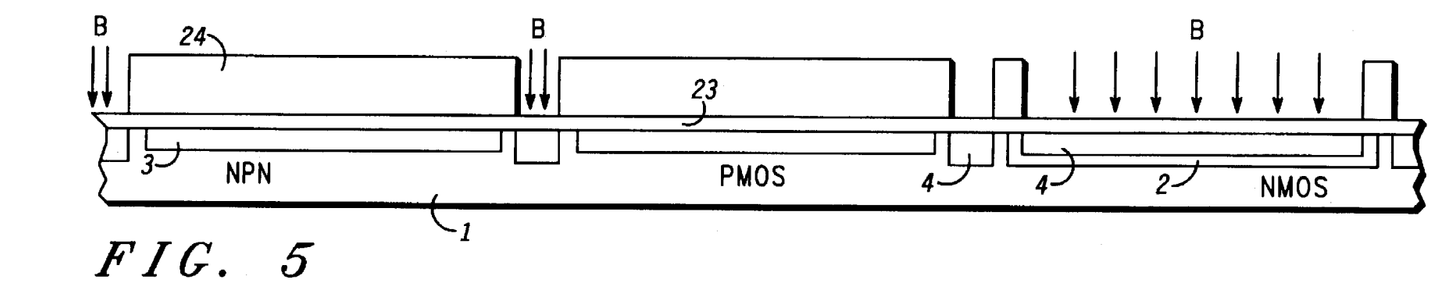

After an accurate removal of the silicon oxide, in a 4:1 hydrofluoric acid (HF) solution for approximately 5 minutes, a thermal oxide 23 of about 700 Å thickness is grown to be used as a mask for the next implant, as shown in FIG. 5. A third masking step is then performed by coverting the thermal oxide 23 with a layer of photoresist 24. Appropriate patterns are opened in the photoresist layer 24, and Boron (B) is implanted with an energy of about 40 KeV and a dose of approximately 1.3E14 at/cm$^2$ as shown schematically in FIG. 5. The photoresist 24 is then removed and the implanted Boron is first annealed at about 1080° C. in $N_2$ for about 35 minutes, then driven in $O_2$ for about 10 minutes at about 1080° C. and finally driven in ($O_2$/1% HCl) atmosphere at about 1080° C. for approximately 10 minutes, thereby creating P+ regions 4.

Figure 6:
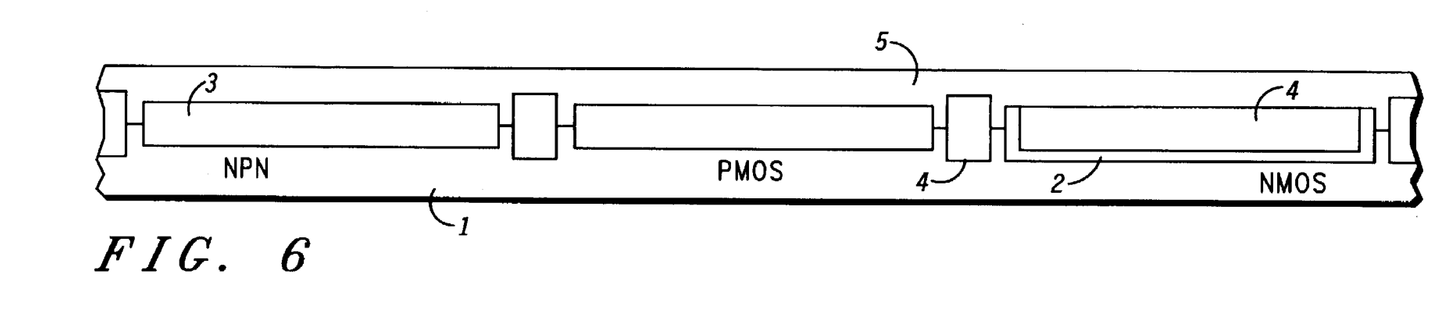

After an accurate removal of the silicon oxide, an epitaxial layer 5 of N-type, arsenic doped silicon, approximately 2 μm thick, having a bulk resistivity around 0.9 ohm-cm, is grown, as shown in FIG. 6. With the epitaxial growth, which takes place at a relatively high temperature, the Arsenic and Boron, previously implanted and driven in defined areas, diffuse again to form the N-, N+ and P+ buried layers, indicated respectively by reference numerals 2, 3 and 4 in FIG. 5. The resulting N- layer 2 is deeper than the P+ layer 4, so that, in the NMOS device, the P+ buried layer 4 is isolated from the substrate 1 by the N- buried layer 2.

Figure 7:
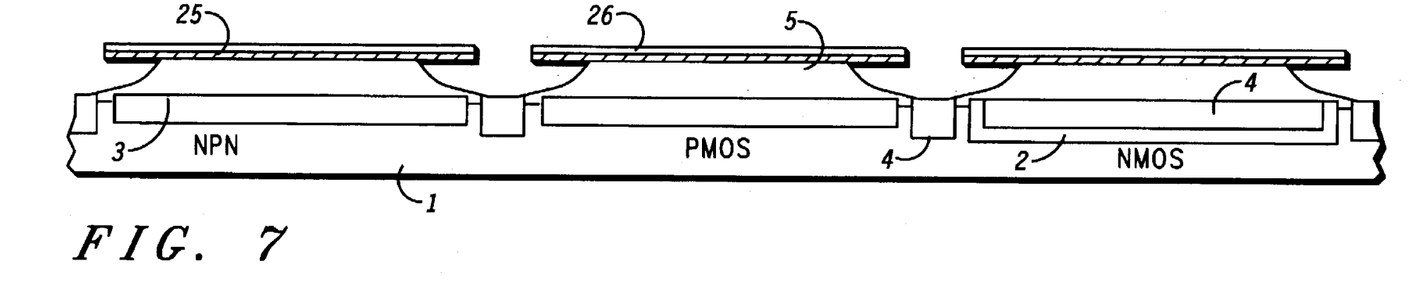

After a thermal oxidation, growing an oxide layer 25 of approximately 700 Å thickness, as shown in FIG. 7, a silicon nitride layer 26, approximately 1250 Å thick, is deposited by a Low Pressure Chemical Vapor Deposition (LPCVD) Process. Areas for providing deep isolation between the buried layers are defined during a fourth masking step. Windows are then prepared through the oxide layer 25 and the nitride layer 26, by a dry etch down to the epitaxial silicon 5. The epitaxial silicon 5 is then wet etched to create moats approximately 9500 Å deep, as shown in FIG. 7.

By an oxidizing heat treatment of the wafer, a deep region of oxide 6, approximately 21500 Å thick is formed into the moats previously defined, while the nitride layer 26 acts as a mask to oxidation for the rest of the wafer.

Figure 8:
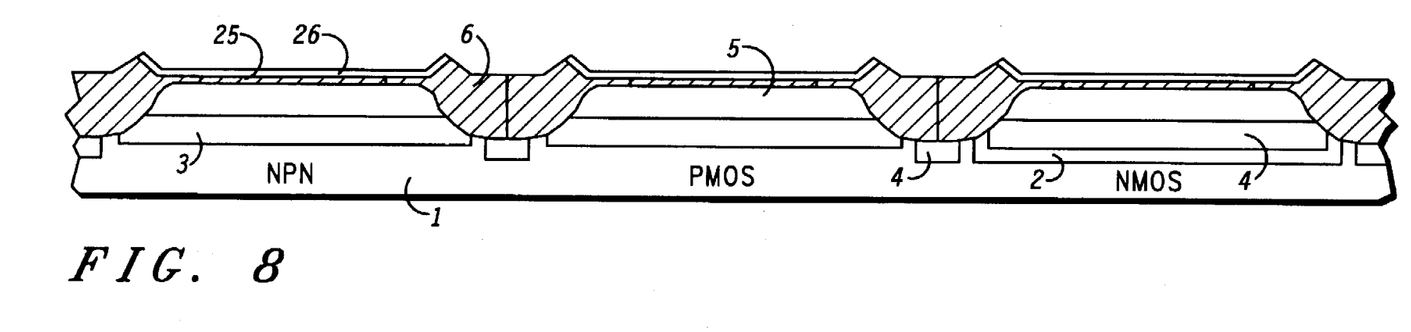

At this stage of the process, the deep region of oxide 6 extends completely through the epitaxial layer 5, as depicted in FIG. 8. To enhance isolation between two adjacent N-type buried layers 3, the P+ buried layer 4 can be used under the deep oxide isolation 6, as illustrated in FIG. 8.

Figure 9:
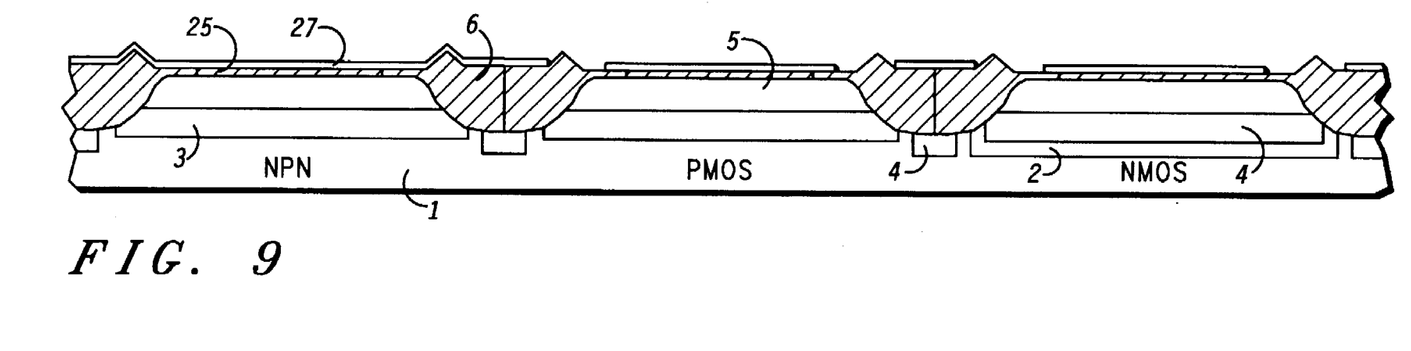

The nitride layer 26 is then stripped off leaving the remaining oxide layer 25 underneath with a thickness of about 500 Å. A second nitride layer 27 is deposited by an LPCVD process to a thickness of approximately 1250 Å, as shown in FIG. 9.

Figure 10:
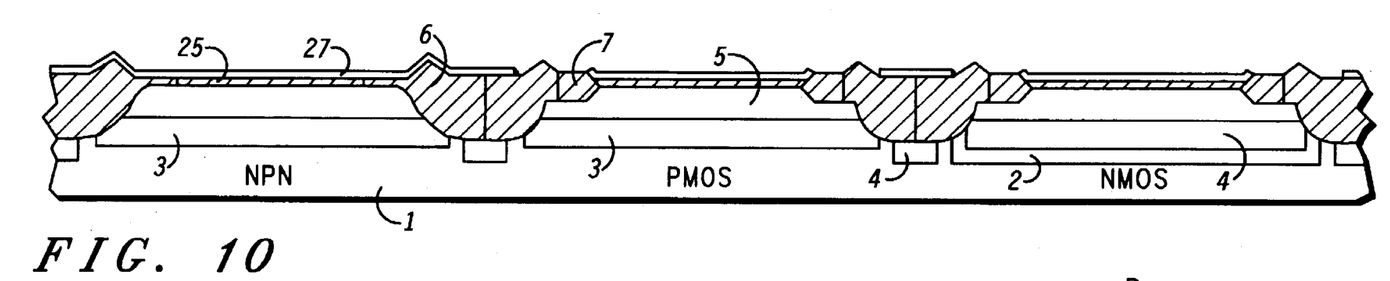

Areas for providing surface isolation of the MOS devices, on either side of the deep oxide isolation 6, are defined by a fifth masking step. Windows are defined through the second nitride layer 27 by a dry etch down to the deep oxide regions 6 underneath, as depicted on FIG. 9. Next a further high pressure heat treatment is performed and a layer of oxide 7 approximately 10,000 Å thick is grown in the previously defined windows, the remaining nitride layer 27 acting as a mask for the rest of the wafer, as shown in FIG. 10. The whole pad structure consisting of the oxide layer 25 and the nitride layer 27 is then removed.

Figure 11:
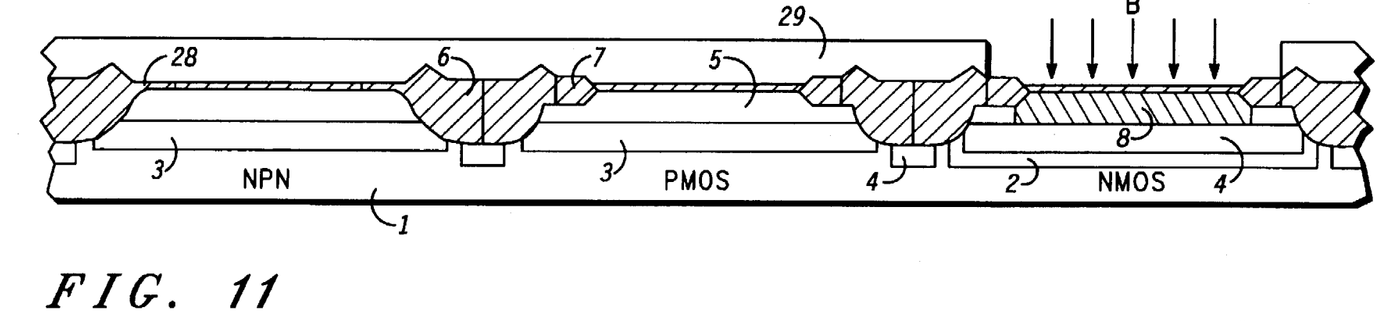

After growing a thermal oxide of approximately 200 Å at the silicon surface, used as a screen oxide to the subsequent implantation and indicated by reference numeral 28 in FIG. 11, a sixth masking step is performed by applying a layer of photoresist 29 in which windows, defining P-well regions, i.e. for the body of the NMOS transistor, are defined. Boron ions are then implanted through the windows with a dose of approximately 6E12 at/cm² and an energy of about 170 KeV to form the P-well regions 8.

The resulting oxide and the photoresist 29 is then removed.

Figure 12:
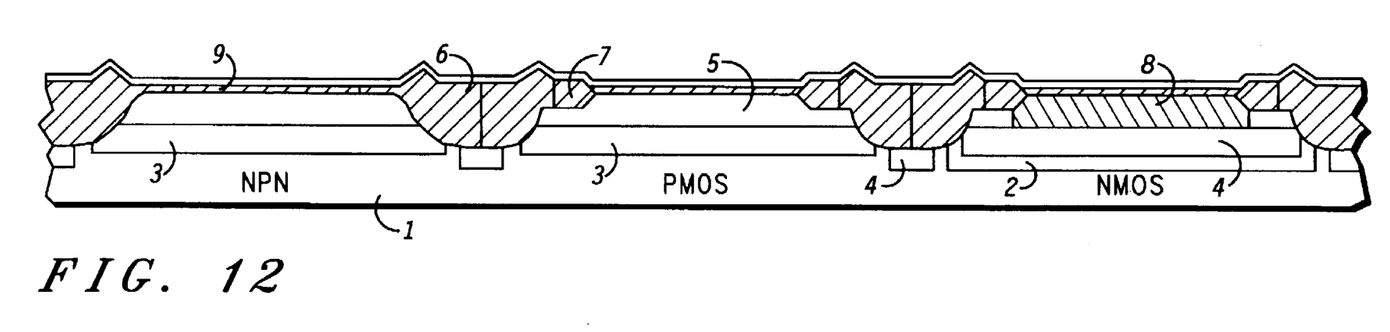
Figure 13:
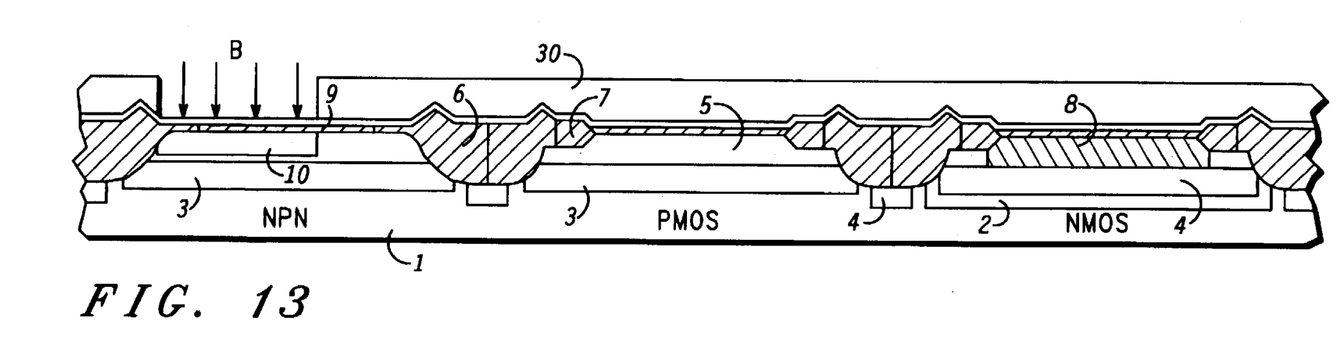
Figure 14:
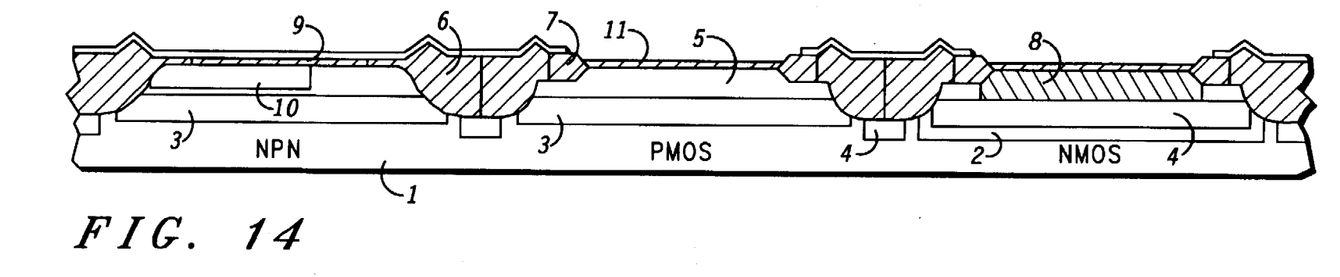

Next, a thermal oxidation is carried out, growing an oxide layer of about 1000 Å and depositing thereon an LPCVD nitride layer, also of about 1000 Å thickness, as shown in FIG. 12, where the combined oxide/nitride stack is indicated by reference numeral 9. By means of a seventh masking and implantation step, an NPN base is implanted through windows defined in a photoresist layer 30, shown in FIG. 13, and through the stack 9, to form a P-base region 10. The implant dose is approximately 1.15E14 at/cm² and the implant energy is about 140 KeV. An annealing step at about 900° C., in an $N_2$ atmosphere then follows. The oxide/nitride stack 9 is then removed from the future PMOS and NMOS device areas, in a dry/wet etch, by means of an eighth patterning step, and a gate oxide layer 11 (of about 400 Å) is thermally grown, as shown in FIG. 14.

Figure 15:
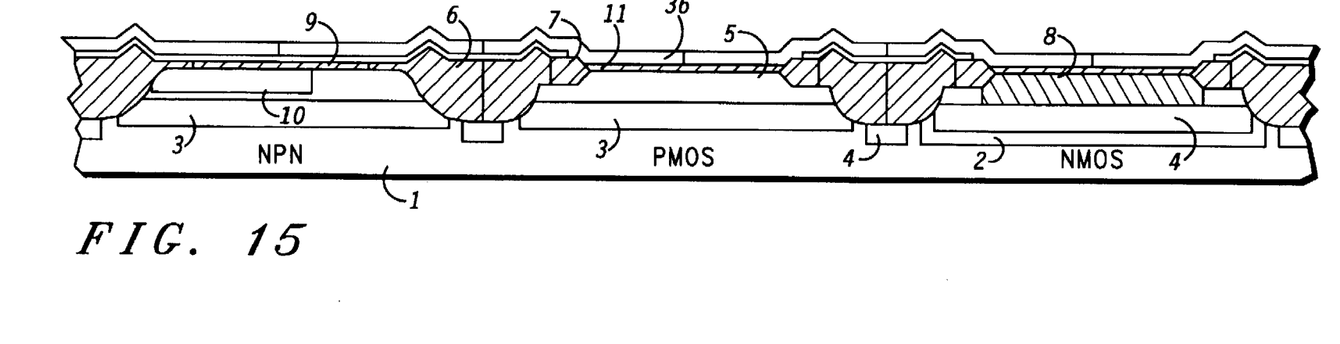
Figure 16:
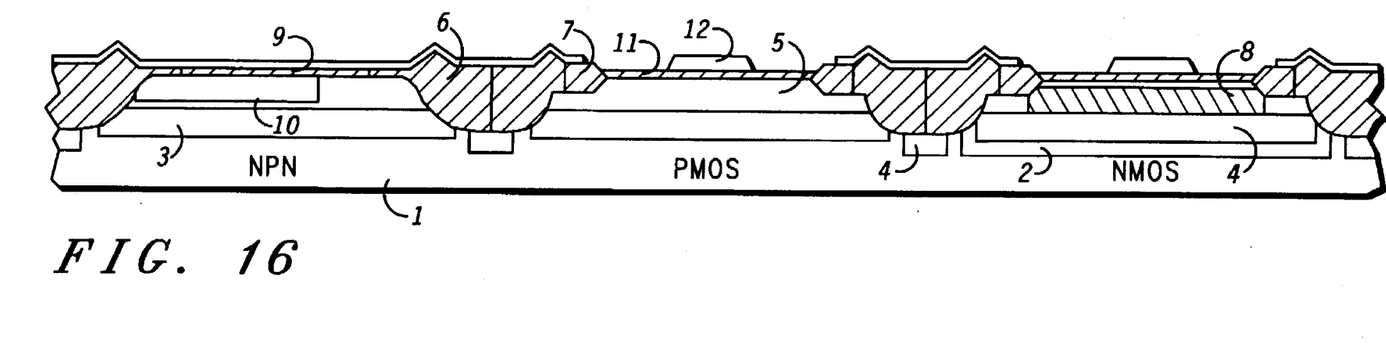

A polysilicon layer 36 with a thickness of about 3500 Å is then deposited by a LPCVD process, as shown in FIG. 15, and is doped with phosphorus. The gates 12 of the MOS devices are formed from the polysilicon layer 36 and defined by a ninth patterning step, as shown in FIG. 16, by removal of excess of the polysilicon layer 36.

Figure 17:
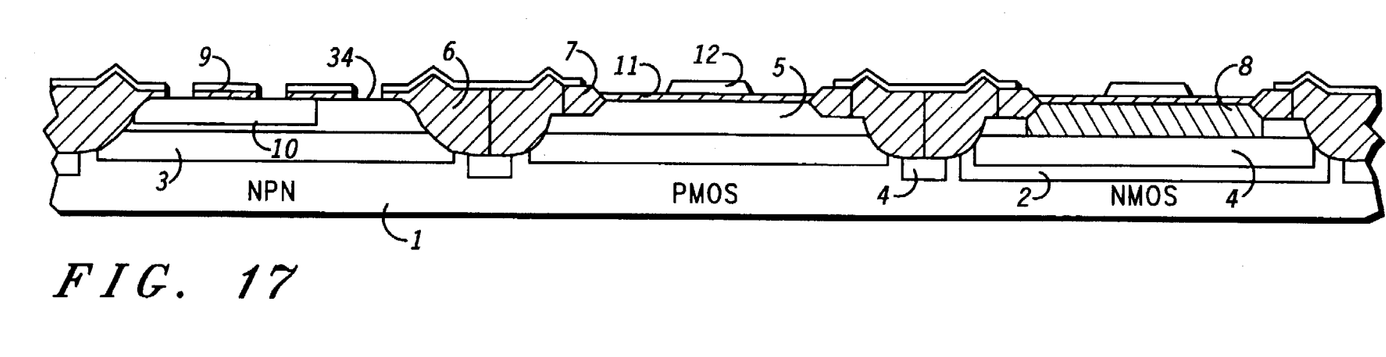
Figure 18:
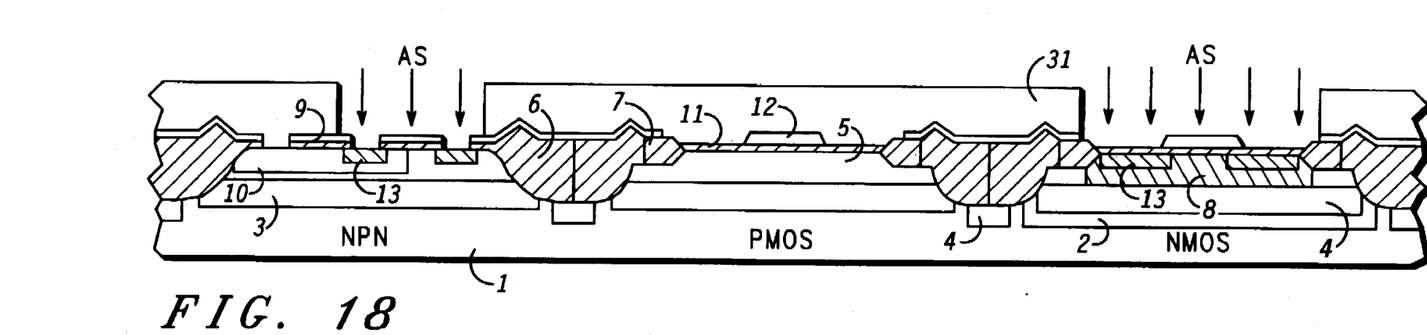

In a tenth patterning step, suitable windows are defined through a photoresist mask for a dry etch of the oxide/nitride stack 9 to form the different openings for emitter, base and collector contacts of the NPN device, such as that shown by reference numeral 34 in FIG. 17. In an eleventh masking and implant step a photoresist layer 31 is applied, as shown in FIG. 18, and windows are opened to define areas to be implanted with Arsenic. The purpose of this heavy implant is to form electrical contact zones, indicated by reference numeral 13 in FIG. 18, for the collector and emitter regions of the NPN transistor and the source and drain regions of the NMOS transistor, shielded by and self-aligned with the relative edge of the polysilicon gates 12 and the surface oxide isolation 11. The Arsenic dose is about 1.4E15 at/cm² and the energy is approximately 30 KeV.

Figure 19:
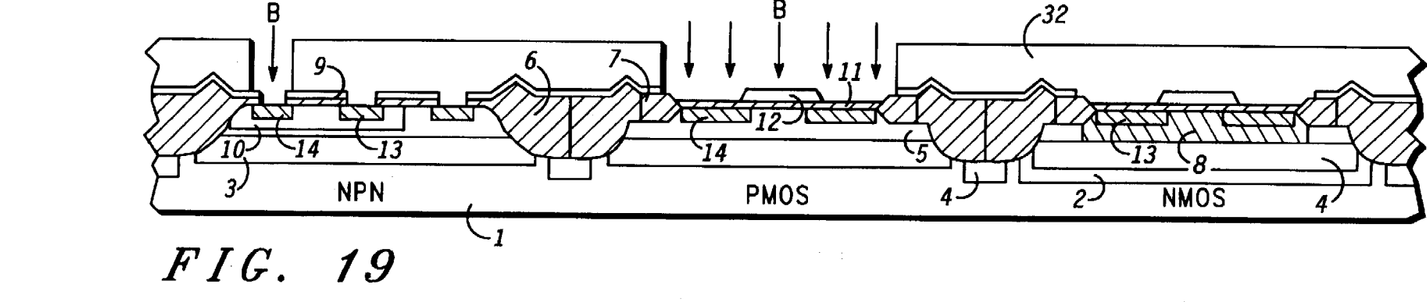

After Arsenic implant annealing, at about 1020° C. in an $N_2$ ambient, for about 17 minutes, a twelfth masking step is performed by applying a photoresist layer 32, shown in FIG. 19, and defining windows in the photoresist layer 32 where a boron implant is done. The purpose of this heavy Boron implant is to form the electrical contact zones, indicated by reference numeral 14 in FIG. 19, for the base region of the NPN transistor and the source and drain regions of the PMOS transistor, shielded by and self-aligned with the relative edge of the polysilicon gates 12 and the surface oxide isolation 11. This implant is then annealed in an $N_2$ ambient, at about 900° C. for approximately 30 minutes and the photoresist layer 32 is removed.

Figure 20:
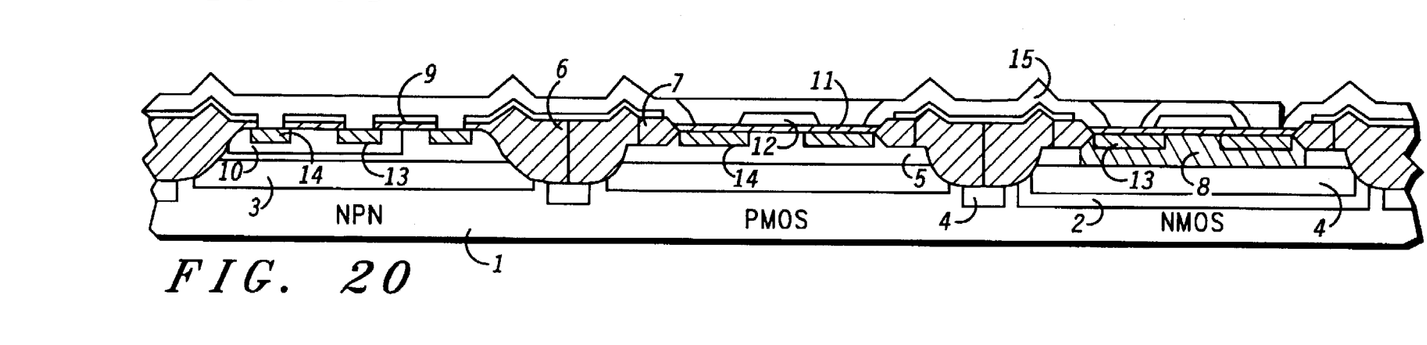
Figure 21:
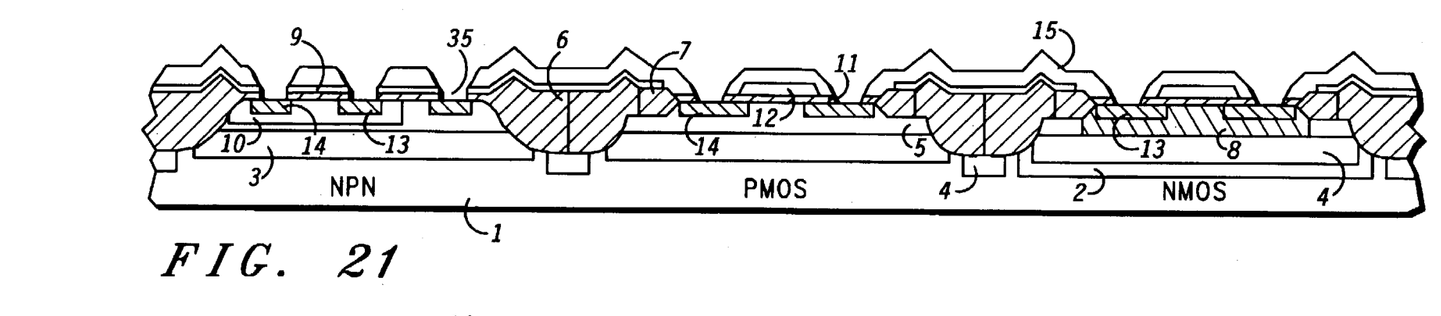

The process continues with a plasma-enhanced vapor deposition (PECVD) step of a first thin undoped layer of oxide, so-called tetraethyl orthosilicate (TEOS), followed immediately with a second layer of phosphorus- and boron-doped TEOS (BPTEOS). A reflow treatment is then performed. The combined stack of TEOS and BPTEOS, is indicated by reference numeral 15 in FIG. 20. During a thirteenth patterning step contact openings 35 are formed in the combined TEOS/BPTEOS stack by a dry removal of the combined stack 15, as is shown in FIG. 21.

Figure 22:
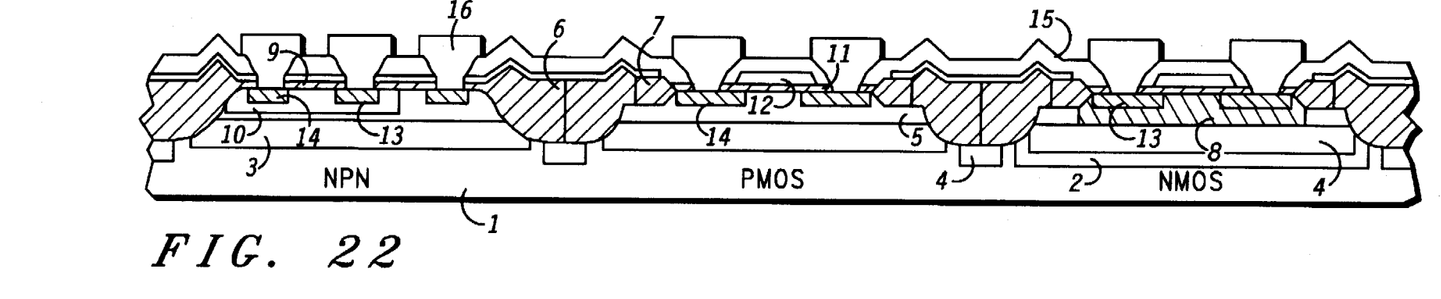

Platinum silicide alloy (PtSi) is then formed in all the contact openings. A titanium/tungsten (TiW) layer is then deposited, followed by a copper/silicon/aluminum alloy (AlCuSi) deposition. Both layers are patterned by a fourteenth masking step and an attack of the two layers is performed, providing the metallic interconnections of the different contacts. The total composite layer, formed with PtSi/TiW/AlCuSi, is indicated by reference numeral 16 in FIG. 22.

Figure 23:
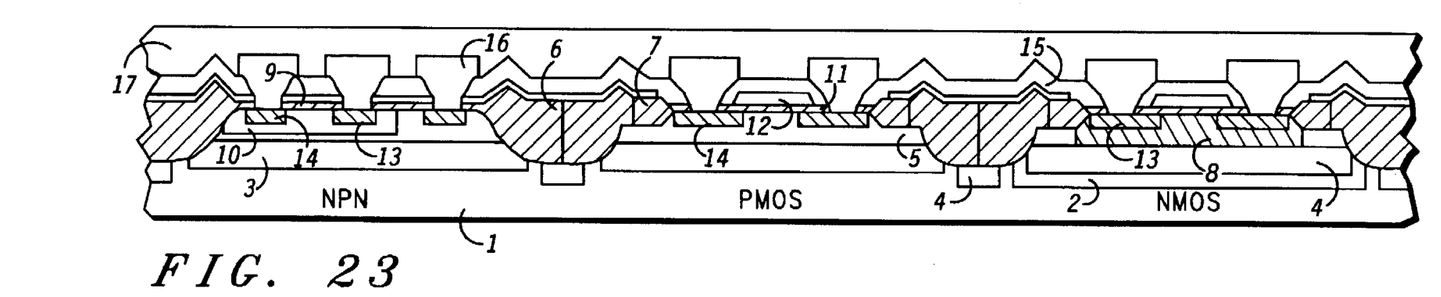

An insulating passivation layer of silicon nitride 17 is deposited by a plasma-enhanced vapor deposition (PECVD) process, as shown in FIG. 23, and the pad areas are defined by means of a sixteenth masking step. Attack of the passivation layer 17 and polishing of the rear of the wafer 1 complete the sequence of the fabrication steps.

Thus, both bipolar and MOS devices have been manufactured, according to the invention, on a single integrated circuit using the same manufacturing process.

Figure 24:
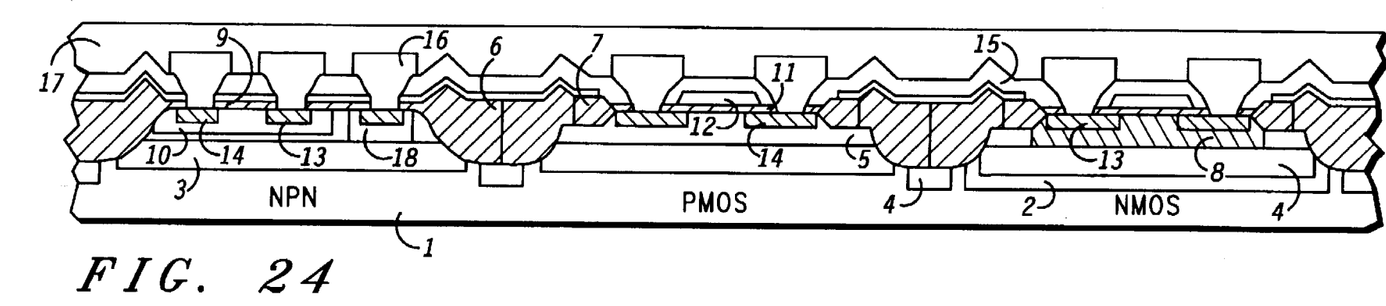
FIG. 24 shows a possible variation in the structure of the NPN device.

It will be appreciated that although only one particular embodiment of the invention has been described in detail, various modifications and improvements can be made by a person skilled in the art without departing from the scope of the present invention. For example, during the sequence of operations of the fabrication process, passive circuit elements such as resistors, capacitors, diodes, etc., required by the particular integrated circuit being made, may be easily formed. The fabrication process may also be modified by adding further masking steps for improving existing devices. For example, to decrease the collector access of the NPN transistor, a deep electric N+ contact 18, as shown in FIG. 24, can be formed to reach through the N+ buried layer, i.e. the collector of the NPN transistor. Another possibility is an optional mask and implant step to adjust the threshold voltages of the MOS devices to a specific desired value.

Figure 25:
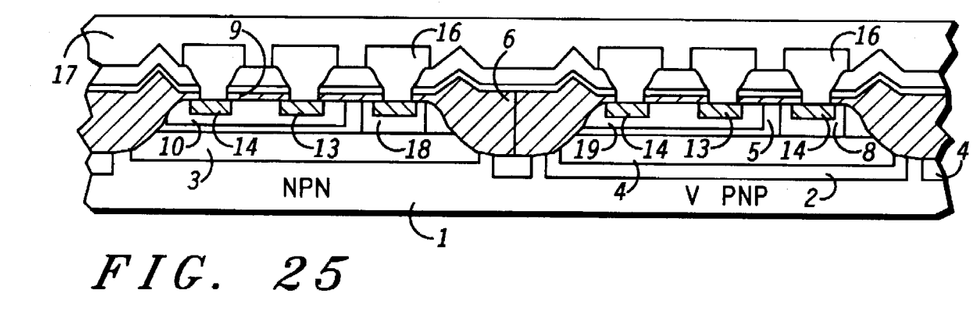
FIG. 25 shows an NPN device on the same substrate with a vertical PNP device.

For some specific applications, other active devices such as isolated collector vertical PNP transistors, may be easily formed. An additional masking step, as well as an N-type implant step, just prior to the heavy arsenic implant, are required to form the N-base region. The P+ emitter can be easily formed by using the source/drain implant for PMOS transistors. Finally, the P+ buried layer acts as the collector, isolated from the substrate by the very first N-type buried layer. The p-well implant may even be used to form a deep electric P-type contact to reach through the P+ buried layer, which decreases the collector access of the vertically isolated PNP transistor. An example of such a vertical PNP transistor is depicted in FIG. 25, where the N-base is indicated by reference numeral 19, the remaining structure having the same reference numerals as the corresponding implant steps in the process described above.

We claim:

1. A method of manufacturing an integrated circuit having at least one lightly doped buried layer of one of a first conductivity type or a second conductivity type and at least one heavily doped buried layer of the one of the first conductivity type or the second conductivity type, the method comprising the steps of:

providing a substrate;

forming a first doping mask on the substrate, wherein the first doping mask defines at least first and second openings on the substrate where the at least one lightly doped buried layer and the at least one heavily doped buried layer are to be formed;

doping a first portion of the substrate through the first opening with a dopant of a low concentration to form the lightly doped buried layer;

forming a second doping mask on the first opening;

doping a second portion of the substrate through the second opening with a high concentration of the dopant, whereby the heavily doped buried layer is formed; and removing the first and second doping masks from the substrate.

2. A method of manufacturing an integrated circuit according to claim 1, further including using purely a bipolar manufacturing process to form the at least one lightly doped buried layer and the at least one heavily doped buried layer.

3. A method of manufacturing an integrated circuit according to claim 1, further including using a BiCMOS manufacturing process where both bipolar and CMOS monolithically integrated devices are manufactured on a single chip.

4. A method of manufacturing an integrated circuit according to claim 3, the integrated circuit having both bipolar and CMOS devices on the single chip, wherein the substrate is a P− silicon substrate, the low doped type of buried layer is an N− buried layer region and the high doped type of buried layer is an N+ buried layer region;

the method further comprising the steps of:

providing a P+ region in the N− buried layer region and in the P− substrate for at least one NMOS device;

providing an N− epitaxial layer over the P+, N+ and N− regions;

providing a P well region in the N− epitaxial layer of the NMOS device extending to the P+ region;

providing a P base region in a first part of the N− epitaxial layer for at least one NPN device;

simultaneously providing:

an N+ region on part of the P base region of the NPN device to form the emitter thereof, an N+ region on a second part of the N− epitaxial layer of the NPN device to form the collector contact thereof, and N+ regions on first and second parts of the P well region of the NMOS device to form the source and drain thereof; and simultaneously providing:

P+ regions on first and second parts of the N− epitaxial layer for at least one PMOS device to form the source and drain thereof, and a P+ region on part of the P base region of the NPN device to form the base contact thereof.

5. A method of manufacturing an integrated circuit according to claim 4, further comprising the step of:

providing a deep N+ region in the second part of the N− epitaxial layer of the NPN device before the N+ region forming the collector contact thereof is formed.

6. A method of manufacturing an integrated circuit according to claim 4, wherein an N− buried layer region is provided in the P− substrate for the NMOS device before the P+ region is provided therein.

7. A method of manufacturing an integrated circuit according to claim 4, wherein the base region of the NPN device is formed on a P++ region provided in the second part of the N− epitaxial layer of the NPN device.

8. A method of manufacturing an integrated circuit according to claim 4, further including the steps of:

providing an N− buried layer region for at least one vertical PNP device in the P− silicon substrate;

providing an N− epitaxial layer over the N− buried layer region;

providing a P-well region in a first part of the N− epitaxial layer of the vertical PNP device;

providing an N-base region in a second part of the N− epitaxial layer of the vertical PNP device;

providing an N+ region on the N-base region of the vertical PNP device to form the base contact thereof; and providing P+ regions on the P-well and N-base regions of the vertical PNP device to form the collector and emitter contacts thereof.

* * * * *